US009531352B1

(12) United States Patent
Aw

(10) Patent No.: US 9,531,352 B1
(45) Date of Patent: Dec. 27, 2016

(54) LATCHED COMPARATOR CIRCUIT

(71) Applicant: Intel Corporation, Santa Clara, CA (US)

(72) Inventor: Chee Hong Aw, Klang (MY)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/748,840

(22) Filed: Jun. 24, 2015

(51) Int. Cl.
H03K 3/356 (2006.01)
H03K 3/037 (2006.01)
G11C 7/10 (2006.01)

(52) U.S. Cl.
CPC ....... *H03K 3/356113* (2013.01); *G11C 7/1087* (2013.01); *H03K 3/037* (2013.01)

(58) Field of Classification Search
USPC .................................................. 365/189.07
See application file for complete search history.

(56) References Cited

U.S. PATENT DOCUMENTS

| 6,925,016 | B2* | 8/2005 | Takahashi | G11C 7/1045 365/189.05 |
| 8,248,838 | B2* | 8/2012 | Tonomura | G11C 7/14 365/148 |
| 2007/0109026 | A1* | 5/2007 | Ho | H03K 5/2481 327/65 |
| 2007/0182454 | A1* | 8/2007 | Dimitriu | H03K 19/01852 326/86 |
| 2009/0034344 | A1* | 2/2009 | Nguyen | G11C 7/1018 365/189.07 |
| 2012/0133438 | A1* | 5/2012 | Tsuchi | H03F 3/45219 330/257 |
| 2013/0093074 | A1* | 4/2013 | Grant | H01L 23/3675 257/693 |

* cited by examiner

*Primary Examiner* — Hoai V Ho
*Assistant Examiner* — Minh Dinh
(74) *Attorney, Agent, or Firm* — Schwegman Lundberg & Woessner, P.A.

(57) ABSTRACT

Some embodiments include apparatuses having input nodes to receive input signals, output nodes to provide output signals, a first stage including a first pair of input transistors, the first pair of transistors including gates coupled to the input nodes, a second stage including a second pair of input transistors, the second pair of transistors including gates coupled to the input nodes, and a third stage including inverters coupled to the output nodes. The inverters are coupled to the first and second stages at the same nodes to switch the output signals between different voltages based on the input signals.

20 Claims, 11 Drawing Sheets

805

US 9,531,352 B1

LATCHED COMPARATOR CIRCUIT

TECHNICAL FIELD

Embodiments described herein pertain to circuits. Some embodiments relate to comparators.

BACKGROUND

Comparator circuits are included in many electronic devices and systems, such as cellular phones, computers, televisions, and other electronic items. Comparator circuits can be used to compare input signals and generate output signals based on the input signals. Different devices and systems may use different comparator circuits having different operating specifications. Examples of such operating specifications are voltage ranges for input signals, operating speed, value for supply voltage, power consumption, and comparator size. Designing comparator circuits having operating specifications suitable for some devices and systems may pose a challenge.

DETAILED DESCRIPTION

Figure 1:
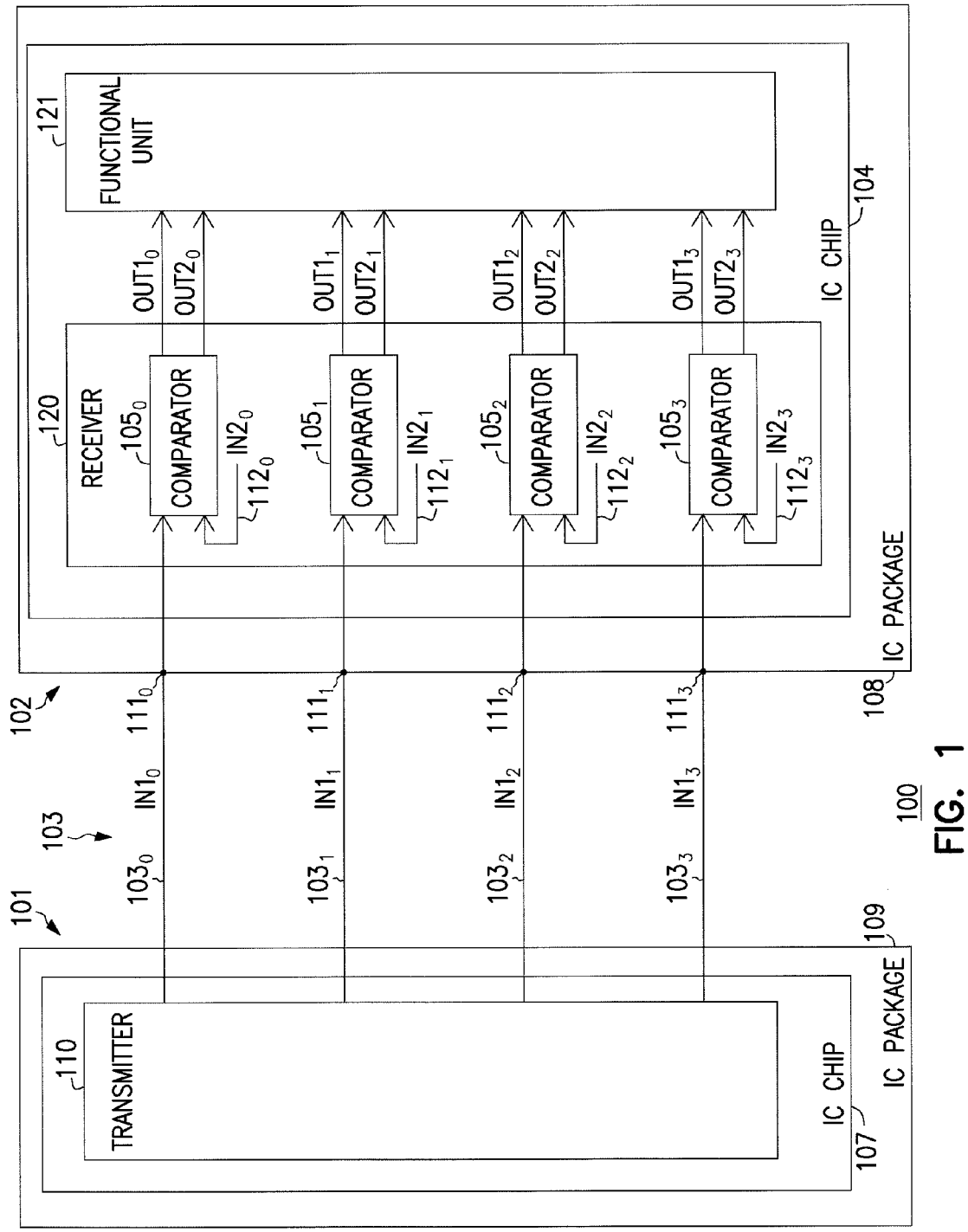
FIG. 1 shows an apparatus including devices having comparators and a connection between the devices, according to some embodiments described herein.

FIG. 1 shows an apparatus 100 including devices 101 and 102, and a connection 103 between devices 101 and 102, according to some embodiments described herein. Apparatus 100 can include or be included in an electronic device or system, such as a computer (e.g., server, desktop, laptop, or notebook), a tablet, a cellular phone, or other electronic devices or systems.

Devices 101 and 102 can include integrated circuit (IC) chips 104 and 107, respectively. Each of IC chips 104 and 107 can include a semiconductor die (e.g., silicon die). IC chips 104 and 107 may be included in IC packages 108 and 109, respectively. Devices 101 and 102 can include a combination of processors (e.g., general-purpose processors, application specific integrated circuit (ASICs)), input/output (I/O) controllers, graphics controllers, memory devices, or other electronic devices.

Connection 103 can include conductive paths (e.g., links) $103_0$, $103_1$, $103_2$, and $103_3$ to conduct signals. Each of conductive paths $103_0$ through $103_3$ can include conductive traces (e.g., wirelines such as metal-based traces) on a circuit board (e.g., printed circuit board) where devices 101 and 102 are located. Conductive paths $103_0$ through $103_3$ can include a bus or can be part of a bus of a circuit board. Devices 101 and 102 can communicate with each other by providing signals on conductive paths $103_0$ through $103_3$. FIG. 1 shows connection 103 having four conductive paths $103_0$ through $103_3$ as an example. The number of conductive paths may vary.

Devices 101 and 102 can include a transmitter 110 and a receiver 120, respectively. Transmitter 110 may transmit signals $IN1_0$, $IN1_1$, $IN1_2$, and $IN1_3$ to receiver 120 on conductive paths $103_0$, $103_1$, $103_2$, and $103_3$, respectively. Each of signals $IN1_0$, $IN1_1$, $IN1_2$, and $IN1_3$ can have values (e.g., voltage values) that represent the values of information (e.g., data) sent from transmitter 110 to receiver 120. Each of signals $IN1_0$, $IN1_1$, $IN1_2$, and $IN1_3$ can be a single-ended signal.

Device 102 can include nodes (e.g., input nodes) $111_0$, $111_1$, $111_2$, and $111_3$. Each of nodes $111_0$, $111_1$, $111_2$, and $111_3$ can include a conductive contact (e.g., solder ball, solder bump, pin, pad, or other types of conductive contacts) located on (e.g., formed on or formed in) IC chip 104 or located on (e.g., formed on or formed in) IC package 108 of device 102. As shown in FIG. 1, nodes $111_0$, $111_1$, $111_2$, and $111_3$ can be coupled to conductive paths $103_0$, $103_1$, $103_2$, and $103_3$, respectively, to receive corresponding signals (e.g., input signals) $IN1_0$, $IN1_1$, $IN1_2$, and $IN1_3$.

Device 102 can also include nodes (e.g., input nodes) $112_0$, $112_1$, $112_2$, and $112_3$, which can be internal nodes of device 102. Nodes $112_0$, $112_1$, $112_2$, and $112_3$ may not be arranged to receive signals from connection 103. Nodes $112_0$, $112_1$, $112_2$, and $112_3$ may be arranged to receive signals (e.g., input signals) $IN2_0$, $IN2_1$, $IN2_2$, and $IN2_3$, which may be generated by device 102. Signals $IN2_0$, $IN2_1$, $IN2_2$, and $IN2_3$ can have the same value. For example, device 102 may generate a reference signal (e.g., a constant reference voltage signal $V_{REF}$, not shown in FIG. 1). Signals $IN2_0$, $IN2_1$, $IN2_2$, and $IN2_3$ can have the same value provided by the reference signal (e.g., signal $V_{REF}$).

Receiver 120 of device 102 can include comparators $105_0$, $105_1$, $105_2$, and $105_3$. Each of the comparators described with reference to FIG. 1 through FIG. 10 can include a latched comparator (e.g., a comparator that is clocked by at least one clock signal during its operation). Thus, in FIG. 1, each of comparators $105_0$, $105_1$, $105_2$, and $105_3$ can include a latched comparator (e.g., a strong-arm type latch), such that each of comparators $105_0$, $105_1$, $105_2$, and $105_3$ can be clocked by at least one clock signal during the operation of each comparator. Receiver 120 can operate a relatively high frequency (e.g., operate using a clock signal having a frequency in the gigahertz range). Comparators $105_0$, $105_1$, $105_2$, and $105_3$ can receive signals $IN1_0$, $IN1_1$, $IN1_2$, $IN1_3$, $IN2_0$, $IN2_1$, $IN2_2$, and $IN2_3$ and generate signals (output signals) $OUT1_0$, $OUT1_1$, $OUT1_2$, $OUT1_3$, $OUT2_0$, $OUT2_1$, $OUT2_2$, and $OUT2_3$, which can be provided to a functional unit (e.g., logic unit) 121 of device 102 for further processing.

Each particular comparator among comparators (e.g., latched comparators) $105_0$, $105_1$, $105_2$, and $105_3$ of receiver 120 can generate output signals having values based on the values of input signals received by that particular comparator. For example, comparator $105_0$ can generate signals $OUT1_0$ and $OUT2_0$ having values based on the values of signals $IN1_0$ and $IN2_0$. Comparator $105_1$ can generate signals $OUT1_1$ and $OUT2_1$ having values based on the values of signals $IN1_1$ and $IN2_1$. Comparator $105_2$ can generate signals $OUT1_2$ and $OUT2_2$ having values based on the values of signals $IN1_2$ and $IN2_2$. Comparator $105_3$ can generate signals $OUT1_3$ and $OUT2_3$ having values based on the values of signals $IN1_3$ and $IN2_3$. FIG. 1 shows receiver 120 having four comparators $105_0$, $105_1$, $105_2$, and $105_3$ as an example. The number of comparators in receiver 120 may vary.

Figure 2:
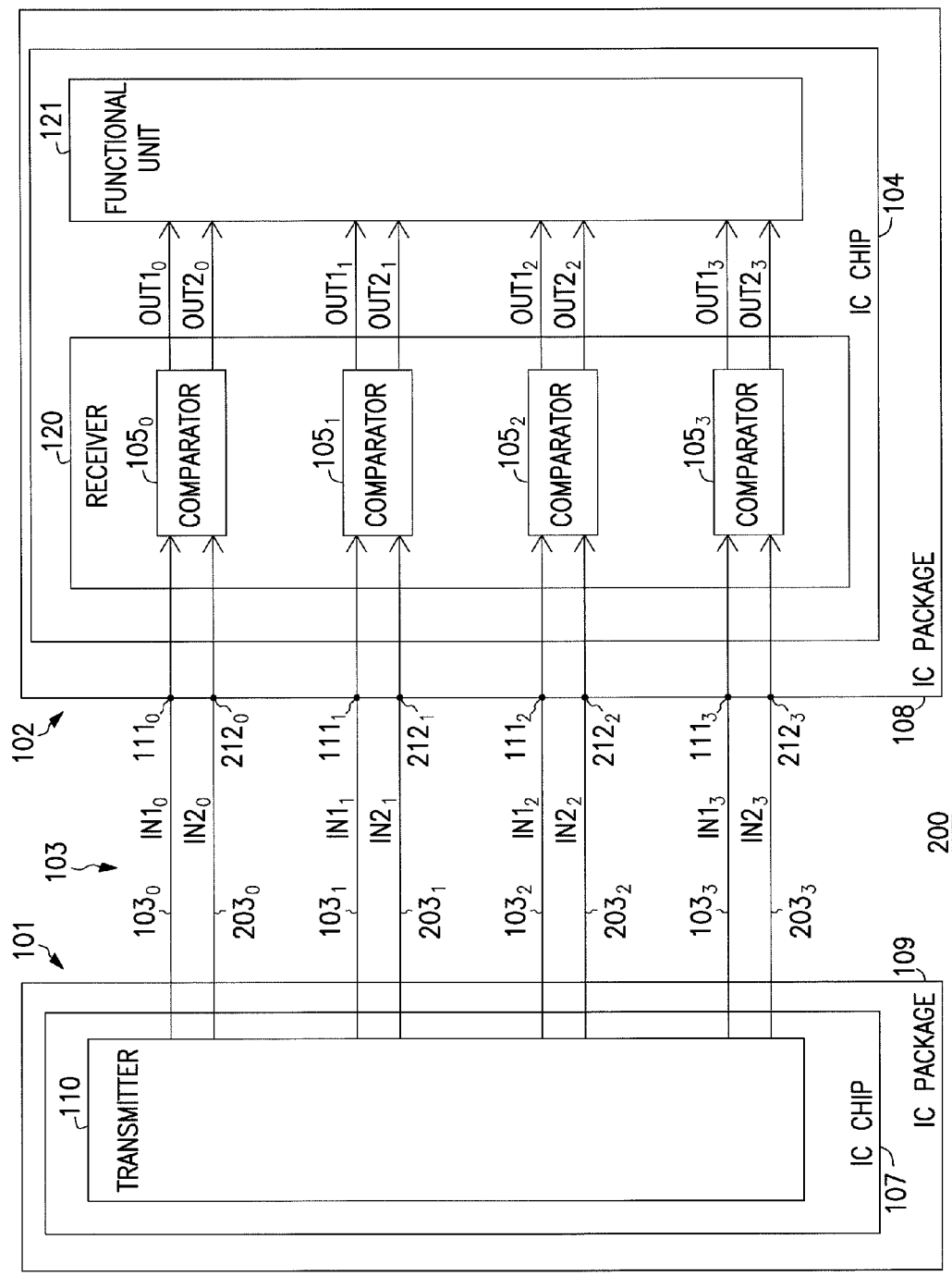
FIG. 2 shows an apparatus that can be a variation of the apparatus of FIG. 1, according to some embodiments described herein.

FIG. 2 shows an apparatus 200 that can be a variation of apparatus 100 of FIG. 1, according to some embodiments described herein. Apparatus 200 can include elements similar to, or identical to, apparatus 100. For simplicity, similar or identical elements in apparatuses 100 and 200 are given the same designation labels.

In apparatus 200, signals $IN2_0$, $IN2_1$, $IN2_2$, and $IN2_3$ may be generated by transmitter 110 of device 101 (instead of by device 102 as in the example of FIG. 1). In FIG. 2, connection 103 can include additional conductive paths $203_0$, $203_1$, $203_2$, and $203_3$ to transmit signals $IN2_0$, $IN2_1$, $IN2_2$, and $IN2_3$, respectively, from transmitter 110 to receiver 120. Device 102 of apparatus 200 can include nodes (e.g., input nodes) $212_0$, $212_1$, $212_2$, and $212_3$ coupled to conductive paths $103_0$, $103_1$, $103_2$, and $103_3$, respectively, to receive corresponding signals $IN2_0$, $IN2_1$, $IN2_2$, and $IN2_3$. Each of nodes $212_0$, $212_1$, $212_2$, and $212_3$ can include a conductive contact (e.g., solder ball, solder bump, pin, pad, or other types of conductive contacts) located on (e.g., formed on or formed in) IC chip 104 or located on (e.g., formed on or formed in) IC package 108 of device 102.

In apparatus 200, signals $IN1_0$, $IN1_1$, $IN1_2$, $IN1_3$, $IN2_0$, $IN2_1$, $IN2_2$, and $IN2_3$ can be different signals. For example, each of signal pairs $IN1_0$ and $IN2_0$, $IN1_1$ and $IN2_1$, $IN1_2$ and $IN2_2$, and $IN1_3$ and $IN2_3$ can be a different pair.

Figure 3A:
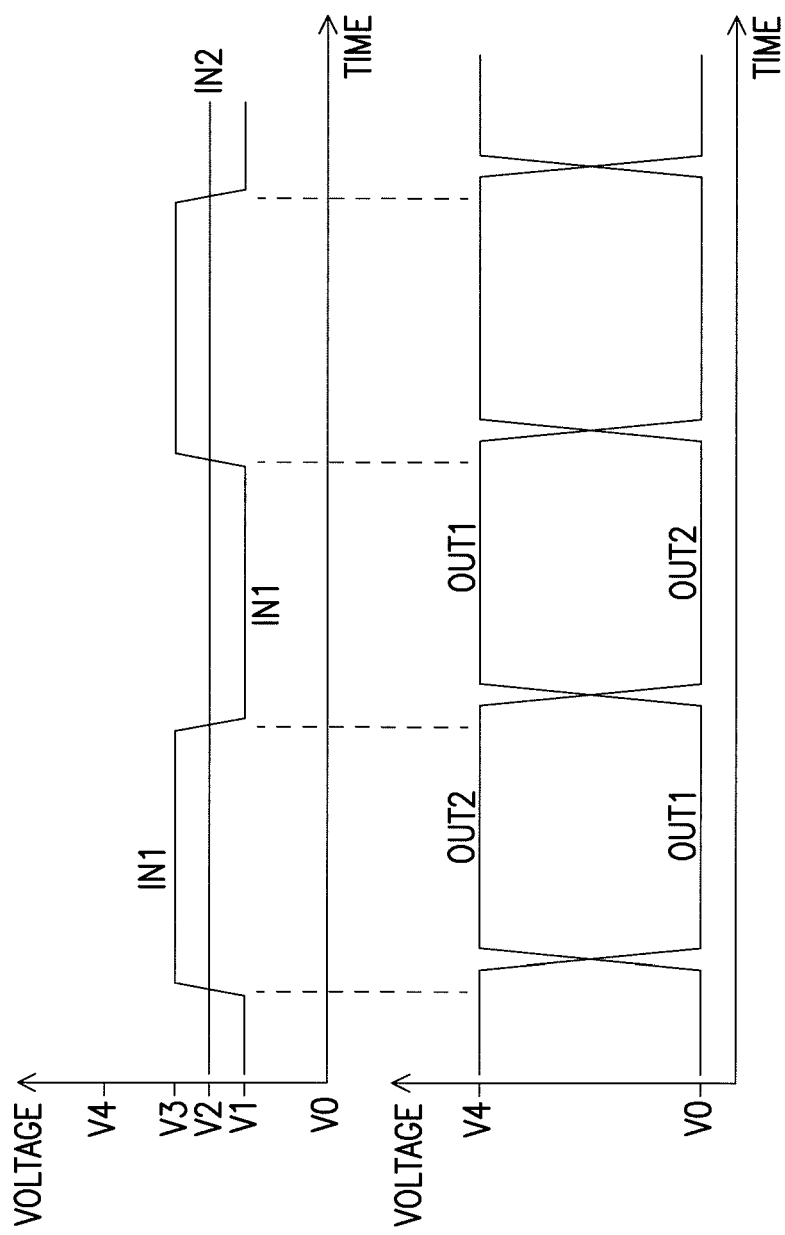
FIG. 3A is an example timing diagram for some of the signals for the apparatus of FIG. 1, according to some embodiments described herein.

FIG. 3A is an example timing diagram for some of the signals for apparatus 100 of FIG. 1, according to some embodiments described herein. In FIG. 3A, signal IN1 can represent one of signals $IN1_0$, $IN1_1$, $IN1_2$, and $IN1_3$ of FIG. 1. Signal IN2 can present one of signals $IN2_0$, $IN2_1$, $IN2_2$, and $IN2_3$ of FIG. 1. As mentioned above with reference to the description of FIG. 1, signals $IN2_0$, $IN2_1$, $IN2_2$, and $IN2_3$ can have the same value provided by a reference signal (e.g., signal $V_{REF}$). Thus, in FIG. 3A, signal IN2 can be provided by a reference signal (e.g., signal $V_{REF}$) that can be used for comparison with signal IN1. As shown in FIG. 3A, signal IN1 can change (e.g., swing) between voltages V1 and V3. Signal IN2 can remain at voltage V2. Voltages V1 and V3 can have values based on the values (e.g., binary 0 and binary 1) of information transmitted from transmitter 110 to receiver 120.

The difference in values between voltages V2 and V1 (e.g., delta 1) and the difference in values between voltages V3 and V2 (e.g., delta 2) can be the same or can be different. As an example, delta 1 or delta 2 can be approximately 50 mV (millivolt) and voltage V4 can be approximately 0.89V. Other values of voltage V4 delta 1 and delta 2 may be used.

As shown in FIG. 3A, each of voltages V1, V2, and V3 can be greater than voltage V0 and less than voltage V4. Voltages V0 and V4 can include supply voltages (e.g., rail supply voltages) of comparators $105_0$, $105_1$, $105_2$, and $105_3$ (FIG. 1 and FIG. 2). For example, voltages V0 and V4 can include supply voltages Vss and Vcc. The value of voltage V0 can include ground potential (e.g., zero volts).

In FIG. 3A, signal (e.g., output signal) OUT1 can represent one of signals $OUT1_0$, $OUT1_1$, $OUT1_2$, and $OUT1_3$ of FIG. 1. Signal OUT2 (e.g., output signal) in FIG. 3A can present one of signals $OUT2_0$, $OUT2_1$, $OUT2_2$, and $OUT2_3$ of FIG. 1. The values of signals (e.g., output signals) OUT1 and OUT2 can be based on the values of signals (e.g., input signals) IN1 and IN2. For example, as shown in FIG. 3A, signal OUT1 can have a value at voltage V0 (e.g., ground) when the value (e.g., value of voltage V3) signal IN1 is greater than the value (e.g., value of voltage V2) of signal IN2. Signal OUT1 can have a value at approximately the value of voltage V4 when the value (e.g., value of voltage V1) signal IN1 is less than the value (e.g., value of voltage V2) of signal IN2. Thus, signal OUT1 can change (e.g., swing) between voltages V0 and V4 when signal IN1 changes between voltages V1 and V3. Signal OUT2 can have values (e.g., voltages) opposite from the values of signal OUT1, as shown in FIG. 3A.

Figure 3B:
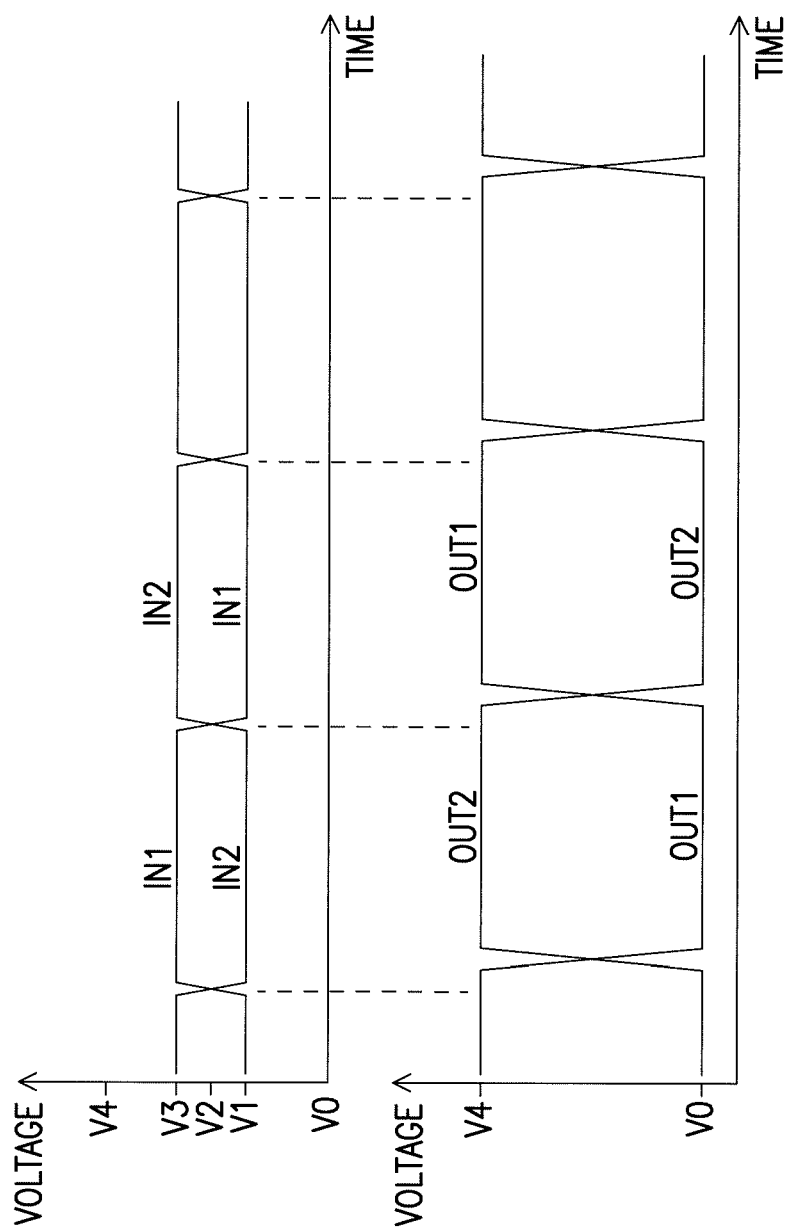
FIG. 3B is an example timing diagram for some of the signals for the apparatus of FIG. 2, according to some embodiments described herein.

FIG. 3B is an example timing diagram for some of the signals for apparatus 200 of FIG. 2, according to some embodiments described herein. Signal IN1 can represent one of signals $IN1_0$, $IN1_1$, $IN1_2$, and $IN1_3$ of FIG. 2. Signal IN2 can present one of signals $IN2_0$, $IN2_1$, $IN2_2$, and $IN2_3$ of FIG. 2. Signals IN1 and IN2 in FIG. 3B can be different signals (e.g., a differential pair). For example, as shown in FIG. 3B, signal IN1 can change (e.g., swing) between voltages V1 and V3. Signal IN2 can also change (e.g., swing) between voltages V1 and V3 but in an opposite direction from that of signal IN1.

In FIG. 3B, signal (e.g., output signal) OUT1 can represent one of signals $OUT1_0$, $OUT1_1$, $OUT1_2$, and $OUT1_3$ of FIG. 2. Signal OUT2 (e.g., output signal) in FIG. 3B can present one of signals $OUT2_0$, $OUT2_1$, $OUT2_2$, and $OUT2_3$ of FIG. 2. The values of signals (e.g., output signals) OUT1 and OUT2 can be based on the values of signals (e.g., input signals) IN1 and IN2. For example, as shown in FIG. 3B, signal OUT1 can have a value at voltage V0 (e.g., ground) when the value (e.g., value of voltage V3) signal IN1 is greater than the value (e.g., value of voltage V1) of signal IN2. Signal OUT1 can have a value at approximately the value of voltage V4 when the value (e.g., value of voltage V1) signal IN1 is less than the value (e.g., value of voltage V3) of signal IN2. Signal OUT2 can have values (e.g., voltages) opposite from the values of signal OUT1, as shown in FIG. 3B.

Each of comparators $105_0$, $105_1$, $105_2$, and $105_3$ described above with reference to FIG. 1, FIG. 2, FIG. 3A, and FIG. 3B can include a comparator described below with reference to FIG. 4 through FIG. 10.

Figure 4:
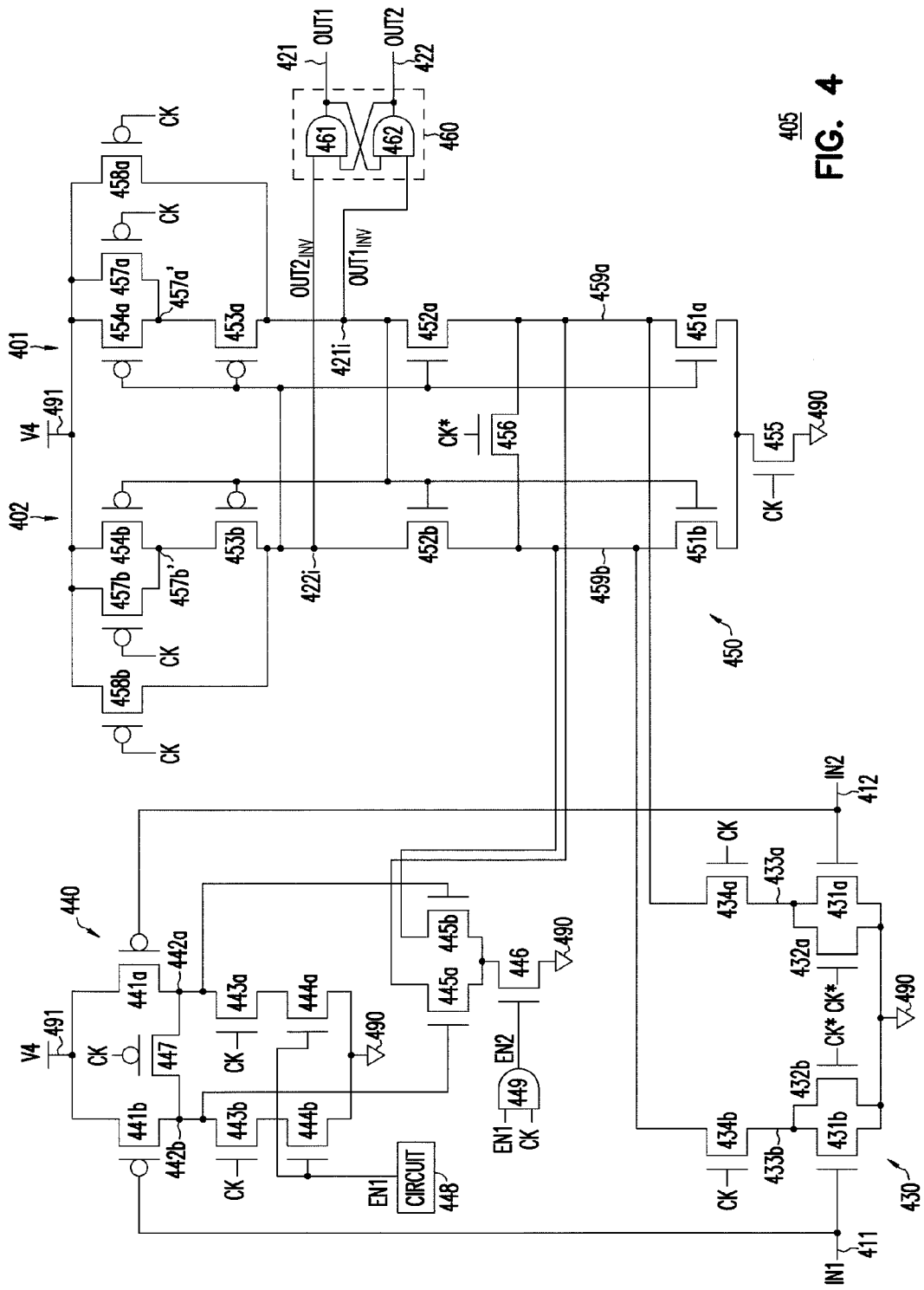
FIG. 4 shows a schematic diagram of an apparatus in the form of a comparator, according to some embodiments described herein.

FIG. 4 shows a schematic diagram of an apparatus in the form of a comparator 405, according to some embodiments described herein. Comparator 405 can operate as a latched comparator (e.g., a strong-arm type latch), such that it can be clocked by clock signals CK and CK*. Signals CK and CK* can be complementary signals (e.g., complementary clock signals). Comparator 405 can be used as a latched comparator for each of comparators $105_0$, $105_1$, $105_2$, and $105_3$ of FIG. 1 and FIG. 2. Comparator 405 can be included in a high-speed receiver, high-speed data link circuitry, on-package interconnect (OPI) circuitry, and other communication devices or systems. The high-speed operation described herein can include circuitry (e.g., comparator 405 of FIG. 4 and receiver 120 of FIG. 1) that operates with clock signals in the gigahertz range. Thus, comparator 405 can be a latched comparator, which is clocked by clock signals (e.g., CK and CK*) having a clock frequency in the gigahertz range.

As shown in FIG. 4, comparator 405 can include nodes 411 and 412 to receive signals IN1 and IN2, respectively, and nodes 421 and 422 to provide signals OUT1 and OUT2, respectively. Nodes 411 and 412 and signals IN1 and IN2 can be referred to as comparator input nodes and comparator input signals, respectively. Nodes 421 and 422 and signals OUT1 and OUT2 can be referred to as comparator output nodes and comparator output signals, respectively.

Comparator 405 can be included in receiver 120 of FIG. 1, such that node 411 can be coupled to (or can be part of) one of nodes $111_0$, $111_1$, $111_2$, and $111_3$, and such that node 412 can be coupled to (or can be part of) one of nodes $112_0$, $112_1$, $112_2$, and $112_3$.

Comparator 405 can also be included in receiver 120 of FIG. 2, such that node 411 can be coupled to (or can be part of) one of nodes $111_0$, $111_1$, $111_2$, and $111_3$, and such that node 412 can be coupled to (or can be part of) one of nodes $212_0$, $212_1$, $212_2$, and $212_3$.

Thus, signal IN1 in FIG. 4 can be one of signals $IN1_0$, $IN1_1$, $IN1_2$, and $IN1_3$ of FIG. 1 or FIG. 2. Signal IN2 in FIG. 4 can be one of signals $IN2_0$, $IN2_1$, $IN2_2$, and $IN2_3$ of FIG. 1 or FIG. 2.

As shown in FIG. 4, comparator 405 can include nodes (e.g., supply nodes) 490 and 491 to receive voltages V0 and V4, respectively. Voltages V0 and V4 can include supply voltages (e.g., Vss and Vcc, respectively) of comparator 405.

Comparator 405 can use clock signals CK and CK* to control (e.g., turn on or turn off) some of the transistors (described below) in comparator 405. Signals CK and CK* can be generated by a device (e.g., device 102 of FIG. 1) that includes comparator 405.

Comparator 405 can include stages (e.g., circuits) 430, 440, and 450, each of which can include transistors arranged (e.g., coupled among each other) in an arrangement shown in FIG. 4. Stage 430 (e.g., input stage) can operate to receive signals IN1 and IN2. Stage 440 (e.g., input assist stage) can operate to assist stage 430 in some situations (e.g., when input common-mode voltage is relatively low) to allow comparator 405 to operate at a relatively wide input common-mode range (e.g., wide input swing). For example, stage 440 can be configured to assist stage 430 to sample signals IN1 and IN2 when a value of at least one of signals IN1 and IN2 is less than one-half of a value of an operating voltage (e.g., voltage V4) of stage 450 (e.g., the operating voltage of comparator 405). Stage 450 (e.g., output stage) can operate to generate signals OUT1 and OUT2 based on signals IN1 and IN2 received at stages 430 and 440. Signals OUT1 and OUT2 can have a signal swing between ground (e.g., V0) and supply voltage (e.g., V4) of comparator 405. Each of signals OUT1 and OUT2 may be used to represent the values (e.g., binary 0 and binary 1) of information (e.g., a bit of information).

As shown in FIG. 4, stage 430 can include transistors (e.g., input transistors or input transistor pair) 431a and 431b having gates to receive (e.g., sample) signals IN2 and IN1, respectively. Transistors 431a and 431b can include a transistor type (e.g., N-type transistor) to allow them to properly receive (e.g., sample) input signals having a relatively high input common-mode voltage (e.g., a common-mode voltage closer to the supply voltage of comparator 405). Examples of n-type transistors include n-channel transistors (n-channel metal oxide semiconductor (NMOS) transistors).

Stage 440 can include transistors (e.g., input transistors or input transistor pair) 441a and 441b having gates to receive (e.g., sample) the same input signals (e.g., signals IN2 and IN1) received by transistors 431a and 431b of stage 430. However, transistors 441a and 441b of stage 440 can have a transistor type (e.g., p-type) that is different from the transistor type (e.g., n-type) of transistors 431a and 431b of stage 430. Examples of p-type transistors include p-channel transistors (p-channel metal oxide semiconductor (PMOS) transistors). Having a different transistor type from transistors 431a and 431b allows transistors 441a and 441b of stage 440 to assist (e.g., complement) transistors 431a and 431b of stage 430 when the input signals have a relatively low input common-mode voltage (e.g., a common-mode voltage closer to ground). Since stage 440 can assist stage 430 to allow comparator 405 to operate at a wider input common-mode range, stage 440 may operate as a wide-swing enabler in comparator 405.

Thus, as described above, comparator 405 includes different types (NMOS and PMOS) of input transistors to receive the same input signals (e.g., IN1 and IN2). This may allow comparator 405 to operate at a relatively higher speed and a relatively wider input common-mode range (a range between an input common-mode voltage closer to supply voltage of comparator 405 and an input common-mode voltage closer to ground) in comparison with some conventional comparators (e.g., strong-arm type latches).

Some particular conventional comparators may operate a relatively wider input common-mode range than other conventional comparators. However, in comparison with such particular conventional comparators, comparator 405 may have a smaller input circuit to receive input signals and a smaller logic circuitry to support the input circuit, may consume less power (e.g., less current), may have a lower input capacitance, and may operate at a relatively low supply voltage (e.g., a voltage of less than 1V).

The combination of stages 430 and 440 in the same comparator 405 may also allow it to operate at similar speed (e.g., at mostly uniform speed) at different values of the input signals (e.g., IN1 and IN2) within the input common-mode range. This is another improvement of comparator 405 over some conventional comparators. For example, some conventional comparators (e.g., either N-type or P-type strong-arm latches) may operate at a lower speed when the input common-mode voltage is approximately one-half of the supply voltage (e.g., near middle of the input common-mode range). The lower speed may be caused by the input transistor pair (e.g., either NMOS or PMOS transistor pair) of the conventional comparators not being fully turned on when input common-mode voltage is approximately one-half of the supply voltage. In comparator 405, since it has a combination of both types (e.g., NMOS and PMOS) of input transistors to receive the same input signals (e.g., IN1 and IN2), the lower speed limitation may be avoided.

Stages 430 and 440 can also include additional transistors that can be arranged as shown in FIG. 4 and can be controlled by corresponding signals (e.g., CK, CK*, EN1, and EN2) at their gates. For example, stage 430 can include transistors (e.g., NMOS transistors) 432a and 432b controlled by signal CK*, and transistors (e.g., NMOS transistors) 434a, and 434b controlled by signal CK. Stage 440 can include transistors (e.g., NMOS transistors) 443a and 443b controlled by signal CK, transistors (e.g., NMOS transistors) 444*a* and 444*b* controlled by signal EN1, transistors (e.g., NMOS transistors) 445*a* and 445*b* controlled by the signals at nodes 442*b* and 442*a*, respectively, a transistor 446 (e.g., NMOS transistors) controlled by signal EN2, and a transistor (e.g., PMOS transistor) 447 controlled by signal CK. Transistors 443*a*, 443*b*, 444*a*, and 44*b* may be sized smaller than other transistors of comparator 405 to reduce power consumption Stage 440 can be arranged to receive a signal EN1 (e.g., stage enable signal) from a circuit (e.g., enable/disable circuit) 448. Circuit 448 can operate such that it can provide signal EN1 with a value (e.g., high) to active (e.g., enable) stage 440 in some situations and another value (e.g., low) to deactivate (e.g., disable) stage 440 some other situations. For example, in a situation where signals IN1 and IN2 are known to operate with both low and high common-mode voltages, circuit 448 may be arranged to provide signal EN1 with a value to activate stage 440 in order to allow comparator 405 to accurately sample signals IN1 and IN2. In another example, in a situation where signals IN1 and IN2 are known to operate with a high input common-mode voltage, circuit 448 may be arranged to provide signal EN1 with another value to deactivate stage 440 while stages 430 and 450 remain activated (e.g., remain operational). Deactivating stage 440 in some situations may save power in comparator 405.

Stage 440 can also be arranged to receive a signal EN2 (e.g., stage enable signal) from a circuit 449, which can include a logic gate (e.g., AND gate). Circuit 449 can operate such that when stage 440 is activated (e.g., by signal EN1), circuit 449 can provide signal EN2 with a value (e.g., high or low) to turn on or turn off transistor 446 based on the combination of signals EN1 and CK.

Stage 450 can include transistors 451*a*, 452*a*, 453*a*, and 454*a* coupled between nodes 490 and 491 (e.g., coupled in a stack arrangement) and can be part of an inverter 401. Stage 450 can also include transistors 451*b*, 452*b*, 453*b*, and 454*b* coupled between nodes 490 and 491 (e.g., coupled in a stack arrangement) and can be part of an inverter 402.

Inverters 401 and 402 can be arranged in a back-to-back crossed coupled configuration, such that the input of inverter 401 and the output of inverter 402 is coupled to each other at node (e.g., inverter output node) 422*i*, and the input of inverter 402 and the output of inverter 401 is coupled to each other at node 421*i* (e.g., inverter output node).

Stage 450 can include a node 459*a* between transistors 451*a* and 452*a* and a node 459*b* between transistors 451*b* and 452*b*. Nodes 459*a* and 459*b* can create tapping points in inverters 401 and 402 of stage 450 for connection to stages 430 and 440. For example, as shown in FIG. 4, transistor 431*a* of stage 430 can be coupled between node 459*a* and node 490, and transistor 431*b* of stage 430 can be coupled between node 459*b* and node 490. Transistors 445*a* and 454*b* of stage 440 can be coupled to nodes 459*a* and 459*b*, respectively.

In comparison with some conventional comparators (e.g., strong-arm type latches having inverters and input pairs connected in a cascade manner), the arrangement between inverters 401 and 402 and transistors 431*a* and 431*b* (e.g., a folded arrangement as shown in FIG. 4) may allow comparator 405 to have a better headroom and to operate at a higher speed (e.g., a higher clock frequency). It may also allow comparator 405 to operate at a relatively low supply voltage (e.g., a supply voltage of less than 1V).

Stage 450 can also include additional transistors that can be arranged as shown in FIG. 4 and can be controlled by corresponding signals (e.g., CK and CK*) at their gates. For example, stage 450 can include transistors (e.g., NMOS transistors) 455 and 456 controlled by signals CK and CK*, respectively, and transistors (e.g., PMOS transistors) 457*a*, 457*b*, 458*a*, and 458*b* controlled by signals CK. In an alternative arrangement, transistor 457*a* can be eliminated. Transistors 453*a* and 454*a* can be replaced by a single transistor between nodes 421*i* and 491. The single transistor can have a size that matches a combined size of transistors 451*a* and 452*a*. In the alternative arrangement, transistor 457*b* can also be eliminated. Transistors 453*b* and 454*b* can be replaced by a single transistor (between nodes 422*i* and 491), which can have a size that matches a combined size of transistors 451*b* and 452*b*.

Stage 450 can include a circuit 460 (e.g., a reset-set (RS) type latch) to provide signals OUT1 and OUT2 based on signals OUT1$_{INV}$ and OUT2$_{INV}$ (e.g., inverter output signals). Circuit 460 can include logic gates (e.g., logic NAND gates) 461 and 462 arranged (e.g., coupled among each other) in an arrangement shown in FIG. 4.

In operation, comparator 405 may include a reset (precharge) phase, a sampling phase, a regeneration phase, and a decision phase.

In the reset phase, transistors 443*a* and 443*b* of stage 430 can be turned off. Transistors 432*a* and 432*b* of stage 430 can be turned on to equalize the voltages of nodes 433*a* and 433*b* (e.g., to cause nodes 433*a* and 433*b* to have the same voltage, such as voltage V0). This allows comparator 405 to accurately sample (e.g., accurately receive) signals IN1 and IN2 during the sampling phase (performed after the reset phase). Transistor 447 of stage 440 can be turned on to equalize the voltages of nodes 442*a* and 442*b*.

Transistor 455 of stage 450 can be turned off. Transistors 457*a*, 457*b*, 458*a*, and 458*b* can be turned on to charge nodes 421*i*, 422*i*, 457*a'*, and 457*b'* to voltage V4 (e.g., supply voltage Vcc of comparator 405). Transistor 456 can be turned on to equalize the voltages of nodes 459*a* and 459*b*. Thus, in the reset phase, both sides (e.g., nodes 421*i* and 422*i*) of inverters 401 and 402 can have the same voltage (e.g., voltage V4), thereby creating an equilibrium state that is unstable and high gain for the circuit of comparator 405.

In the sampling phase, transistors 432*a* and 432*b* of stage 430 can be turned off. One side of each of stages 430 and 440 can receive signal IN2 at node 412, which is coupled to the gate of transistor 431*a* of stage 430 and the gate of transistor 441*a* of stage 440. The other side of each of stages 430 and 440 can receive signal IN1 at node 411, which is coupled to the gate of transistor 431*a* of stage 430 and the gate of transistor 441*a* of stage 440.

Transistors 434*a* and 434*b* of stage 430 can be turned on to couple transistors 431*a* and 431*b* of stage 430 to nodes 459*a* and 459*b*, respectively. Transistors 445*a* and 445*b* stage 440 can be turned on to couple transistors 441*b* and 441*a* of stage 440 to nodes 459*a* and 459*b*, respectively.

As described above, transistors 431*a* and 431*b* of stage 430 can include NMOS transistors and transistors 441*a* and 441*b* of stage 440 can include PMOS transistors. Transistors 441*a* and 441*b* can have a smaller size than transistors 431*a* and 432*b*. NMOS transistors may normally be faster (e.g., switch faster) than PMOS transistors. Thus, the operation in the sampling phase of comparator 405 may mainly be achieved by (e.g., dominated by) transistors 431*a* and 431*b* of stage 430, especially when input common-mode voltage in the sampling phase is relatively high.

In the sampling phase, when the value (e.g., voltage value) of signal IN1 is greater than the value (e.g., voltage value) of signal IN2, node 459*b* may have a lower voltage than node 459*a*. Due to a lower voltage at 459*b*, transistor 452*b* (for which its gate is still at voltage V4 (e.g., precharged at voltage V4 from the reset phase)) may see higher voltage $V_{DS}$ (drain-to-source voltage) than transistor 452*a*. Thus current $I_{DS}$ (drain-to-source current) of transistor 452*b* may be greater than current $I_{DS}$ across transistor 452*a*. Therefore, transistor 452*b* may sink more current from node 422*i*. This may create a disturbance to the unstable equilibrium state of comparator 405. Due to the push-pull effect in the regeneration phase (described below), the voltages at nodes 421*i* and 422*i* may continue to be pulled in opposite directions. For example, the voltage of node 422*i* may be pulled (e.g., pulled down) until it reaches the value of voltage V0 (e.g., ground) of node 490. The voltage at node 421*i* may be pulled (e.g., pulled up) unit it reaches the value of the voltage (e.g., V4=Vcc) at node 491.

As mentioned above, transistors 431*a* and 431*b* of stage 430 can include NMOS transistors. Thus, if input common-mode voltage in the sampling phase is relatively low, transistors 431*a* and 431*b* of stage 430 may not be in full function (e.g., may not fully turned on) because NMOS transistors may normally operate at gate-to-source voltage ($V_{GS}$) being greater than the transistor threshold voltage (Vt) in order to be in full function (e.g., fully turned on). In this situation, transistors 441*a* and 441*b* (which can include PMOS transistors) of stage 440 may operate to assist the sampling operation. For example, when the value (e.g., voltage value) of signal IN1 is greater than the value (e.g., voltage value) of signal IN2, node 442*a* may have higher voltage than node 442*b* because transistor 441*a* may have a larger $V_{GS}$ than transistor 441*b* and a lower $R_{ON}$ (transistor on-resistance) than transistor 441*b*. A higher voltage at node 442*b* may cause transistor 445*b* to have a larger $V_{GS}$ than transistor 445*a* and may cause transistor 445*b* to sink more current from node 459*b*. Due to a lower voltage at 459*b*, transistor 452*b* (for which its gate is still at voltage V4 (e.g., precharged at voltage V4 from the reset phase)) may see higher voltage $V_{DS}$. Thus, current $I_{DS}$ of transistor 452*b* may be greater than current $I_{DS}$ across transistor 452*a*. This situation is similar to the situation when input common-mode voltage is not low and the trigger is done by transistors 431*a* and 431*b*. For example, voltage levels at nodes 421*i* and 422*i* may be pulled to opposite directions until they reach the value of the voltages V0 and V4.

Thus, in the operations described above, stage 440 (e.g., based at least on the operation of transistors 441*a* and 441*b*) may operate to assist (e.g., complement) stage 430 (e.g., assist at least the function of transistors 431*a* and 431*b*) when input common-mode voltage is relatively low.

In the regeneration phase and decision phase, after receiving initial trigger from transistors 431*a* and 431*b*, the voltages at nodes 421*i* and 422*i* of inverters 401 and 402 may continue to be pulled until they reach voltages V0 and V4, respectively.

Figure 5:
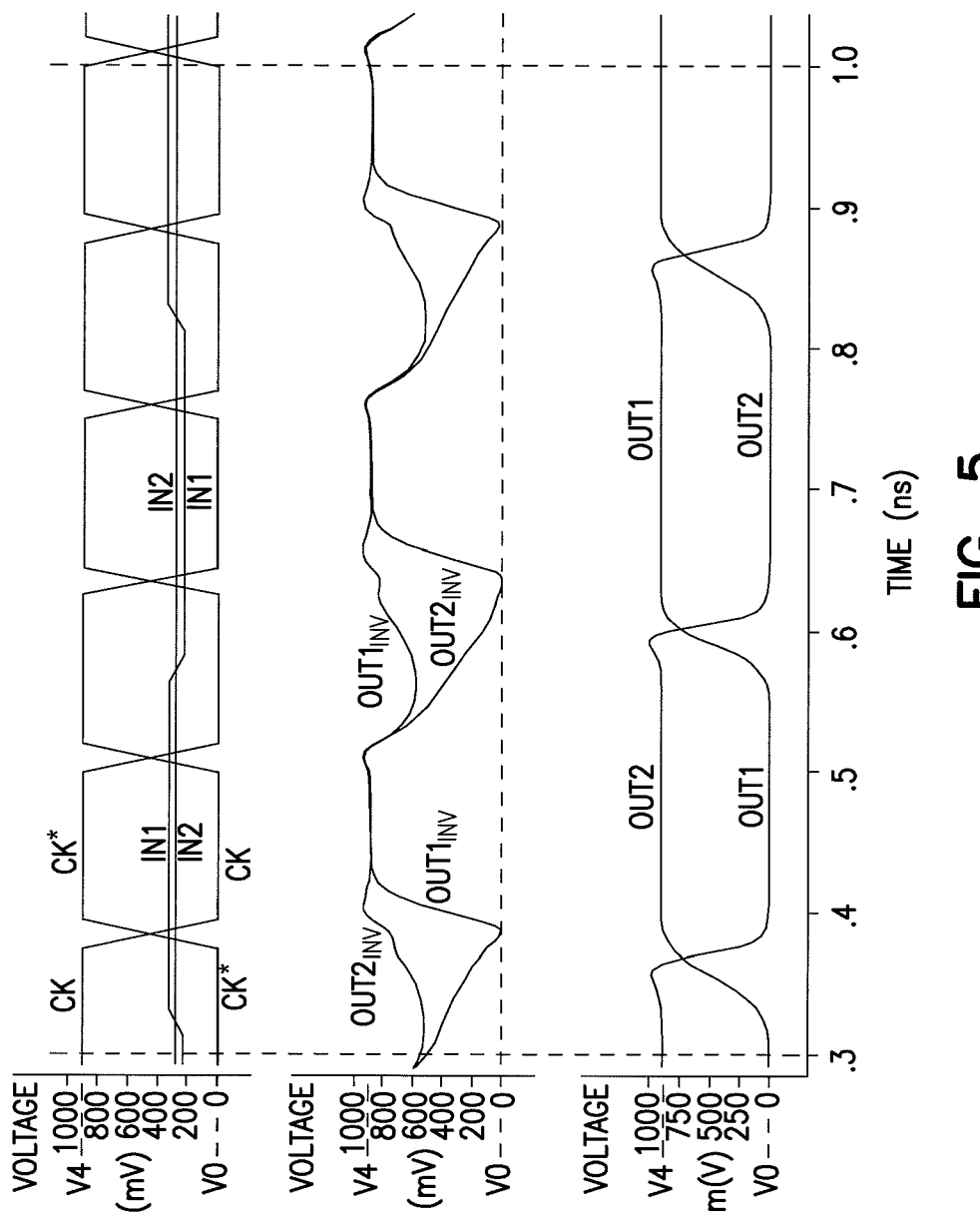
FIG. 5 is an example timing diagram for some of the signals for the comparator of FIG. 4 operating with a relatively low input common-mode voltage, according to some embodiments described herein.

FIG. 5 is an example timing diagram for some of the signals for comparator 405 of FIG. 4 operating with a relatively low input common-mode voltage, according to some embodiments described herein. In the example of FIG. 4, the low input common-mode voltage comparator 405 may operate at a temperature of −40° C., voltage V4 of approximately 0.89V, and signal CK and CK* having a frequency 4 GHz (gigahertz). As described above, transistors 441*a* and 441*b* of stage 440 can include PMOS transistors. This allows comparator 405 (e.g., based at least on the operation of transistors 441*a* and 441*b*) to correctly sample low input common-mode voltage provided by signals IN1 and IN2. Inverters 401 and 402 of stage 450 can also toggle signals (e.g., inverter output signals) $OUT_{INV}$ and $OUT2_{INV}$ between V0 (e.g., Vcc) and V4 (e.g., ground). This allows circuit 460 of stage 450 to properly switch each of signals (e.g., comparator output signals) OUT1 and OUT2 between voltages V0 and V4.

The timing diagram of FIG. 5 shows one of the improvements that comparator 405 may have over some conventional comparators. For example, at similar operating conditions (voltage, temperature, and clock frequency) described above in the example of FIG. 5 for comparator 405, inverters in some conventional comparators may be unable to toggle inverter output signals to ground. This may cause comparator output signals (which are based on the inverter output signals) of the conventional comparators to fail to switch or switch improperly. Thus, operational failure may occur in some conventional comparators. Comparator 405, however, may operate properly with a relatively low input common-mode voltage, as shown in the example of FIG. 5.

Figure 6:
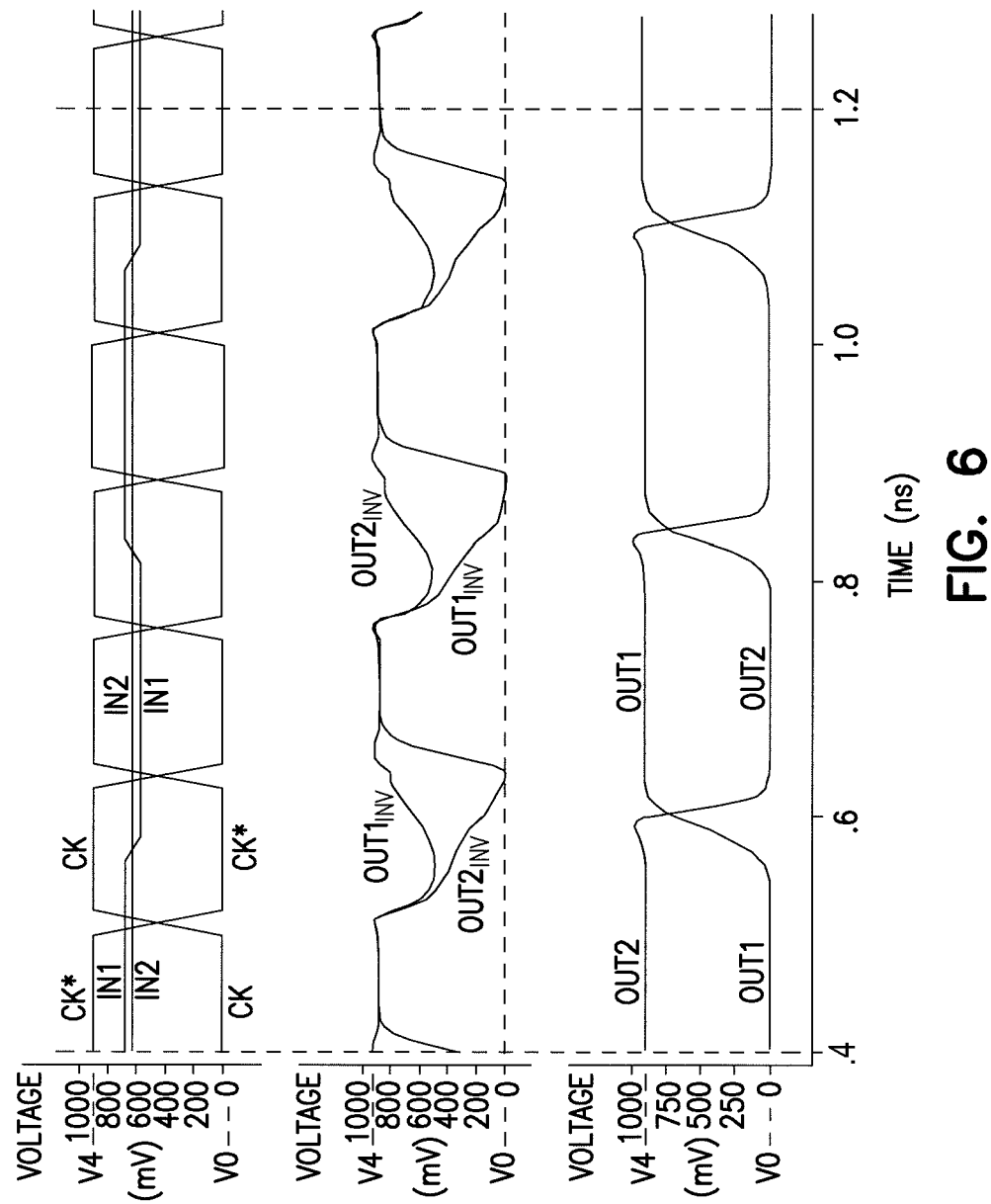
FIG. 6 is an example timing diagram for some of the signals for the comparator of FIG. 4 operating with a relatively high input common-mode voltage, according to some embodiments described herein.

FIG. 6 is an example timing diagram for some of the signals for comparator 405 of FIG. 4 operating with a relatively high input common-mode voltage, according to some embodiments described herein. The operating conditions for comparator 405 in the example timing diagrams of FIG. 5 and FIG. 6 can be the same (operating temperature of −40° C., voltage V4 of approximately 0.89V, and signal CK and CK* having a frequency of 4 GHz). As described above, transistors 431*a* and 431*b* of stage 430 can include NMOS transistors. This allows comparator 405 (e.g., based at least on the operation of transistors 431*a* and 431*b*) to correctly sample high input common-mode voltage provided by signals IN1 and IN2. Inverters 401 and 402 of stage 450 can also toggle signals $OUT1_{INV}$ and OUT2 between V0 (e.g., Vcc) and V4 (e.g., ground). This allows circuit 460 of stage 450 to properly switch each of signals OUT1 and OUT2 between voltages V0 and V4.

Thus, as shown in the example timing diagram of FIG. 6, comparator 405 may operate properly when the input common-mode voltage is relatively low or relatively high. This allows comparator 405 to operate at a wider input common-mode range in comparison with some conventional comparators.

Figure 7:
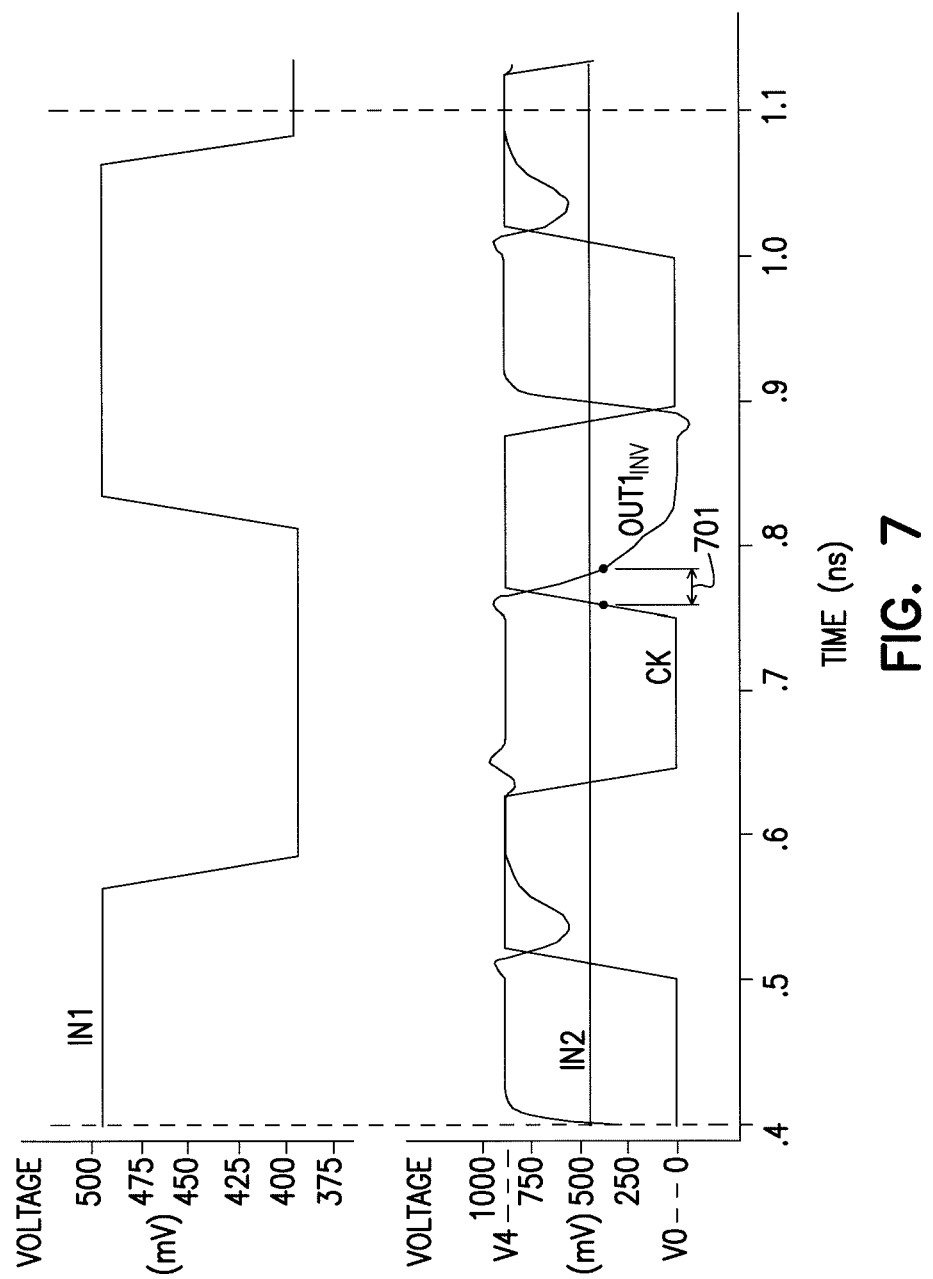
FIG. 7 shows a schematic diagram of an example relationship between clock and output signals of the comparator of FIG. 4, according to some embodiments described herein.

FIG. 7 shows a schematic diagram of an example relationship between clock and output signals of comparator 405 of FIG. 4, according to some embodiments described herein. The values of voltages (in mV) and time (in nanosecond(ns)) shown in FIG. 7 are example values. Other values may be used. In FIG. 7, a time interval 701 represents a time delay (e.g., clock to output delay) between signals CK and $OUT1_{INV}$. The frequency of signal CK in FIG. 7 is approximately 4 Ghz. Time interval 701 has a value of approximately 19.71 ps (picosecond). In comparison with some conventional comparators having a similar size and operating at a similar conditions (e.g., a supply voltage of 0.89V, an operating temperature of −40° C., and a clock signal having a frequency of 4 GHz), time interval 701 of comparator 405 may be less than (e.g., at least one-half less than) that of conventional comparators. Thus, comparator 405 may provide output information (e.g., signals OUT1 and OUT2) relatively faster than some conventional comparators.

Figure 8:
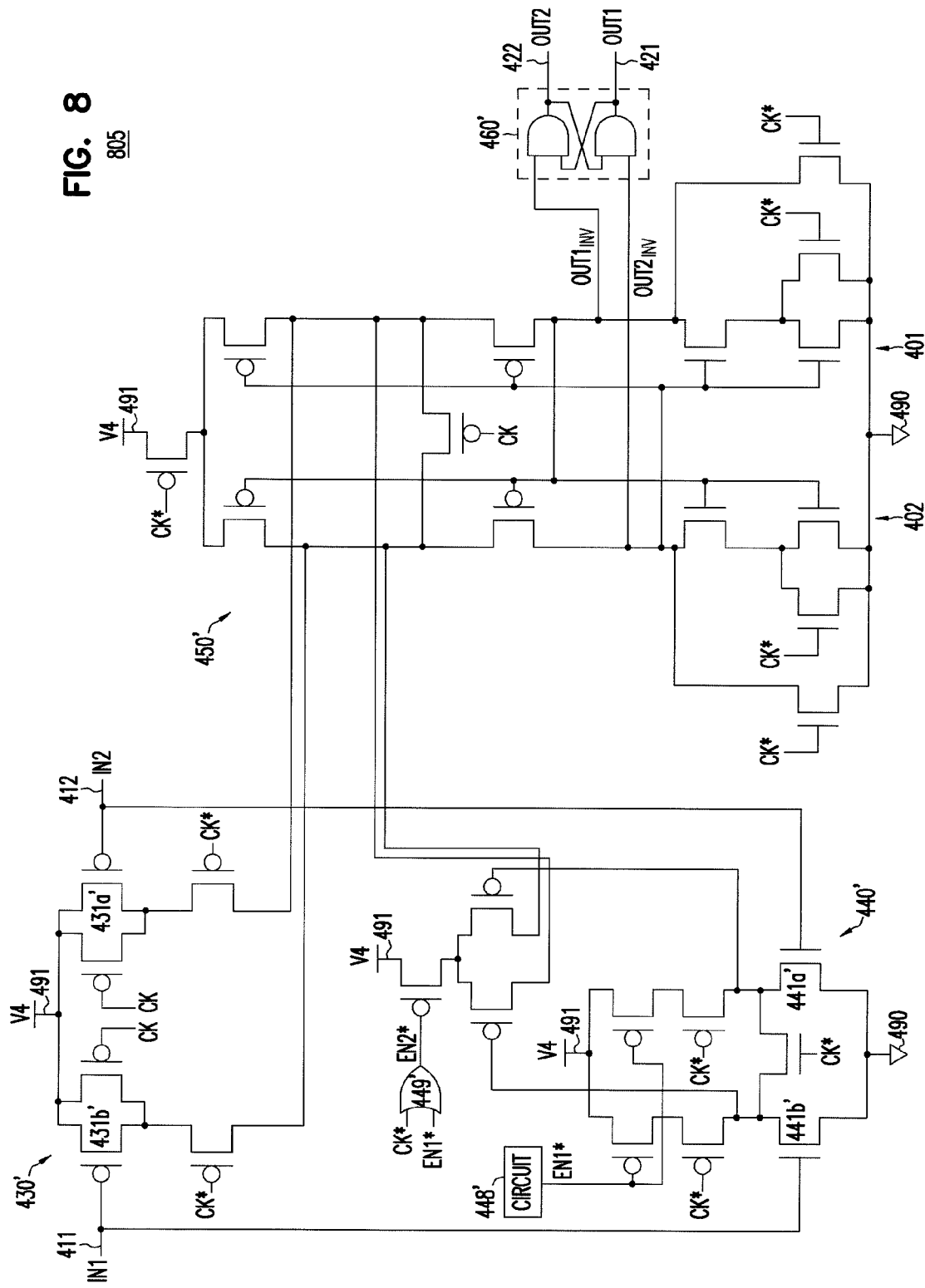
FIG. 8 shows a schematic diagram of an apparatus in the form of another comparator, which can be a variation of the comparator of FIG. 4, according to some embodiments described herein.

FIG. 8 shows a schematic diagram of an apparatus in the form of a comparator 805, which can be a variation of comparator 405 of FIG. 4, according to some embodiments described herein. Comparator 805 can have the same type as comparator 405 (e.g., latched comparator) and can be clocked by clock signals CK and CK* during its operation. As shown in FIG. 8, comparator 805 can include stages 430', 440', and 450' that can correspond to stages 430, 440, and 450, respectively, of comparator 405 of FIG. 4, and circuits 448', 449', and 460' that can correspond to circuits 448, 449, and 460 of comparator 405 of FIG. 4. However, as shown in FIG. 4 and FIG. 8, the transistor types in stages 430', 440', and 450' of comparator 805 in FIG. 8 can be different from the transistor types in corresponding stages 430, 440, and 450 of comparator 405 in FIG. 4.

For example, transistors 431$a$' and 431$b$' of stage 430' of comparator 805 can include a transistor type (e.g., PMOS) that is different from the transistor type (e.g., NMOS) of transistors 431$a$ and 431$b$ of stage 430 of comparator 405.

In another example, transistors 441$a$' and 441$b$' of stage 440' of comparator 805 can include a transistor type (e.g., PMOS) that is different from the transistor type (e.g., NMOS) of transistors 441$a$ and 441$b$ of stage 440 of comparator 405. In the arrangement of comparator 805, stage 440' can be configured to assist stage 430' to sample signals IN1 and IN2 when a value of at least one of signals IN1 and IN2 is greater than one-half of a value of an operating voltage (e.g., voltage V4) of stage 450' (e.g., the operating voltage of comparator 805).

Other transistors of comparator 805 can also have a different transistor type different from the transistor type corresponding transistors of comparator 405, as shown in FIG. 8. For simplicity, detailed description of differences between other corresponding transistors of comparators 405 and 805 in FIG. 8 is omitted from the description of FIG. 8.

Circuit 448' can operate such that signals EN1* for comparator 805 of can be a complement (e.g., inverted version) of signal EN1 for comparator 405 of FIG. 5. Circuit 449 in FIG. 8 can include a logic gate (e.g., OR gate) to provide signal EN2* with a value (e.g., high or low) to turn on or turn off transistor 446 based on the combination of signals EN1* and CK*.

Figure 9:
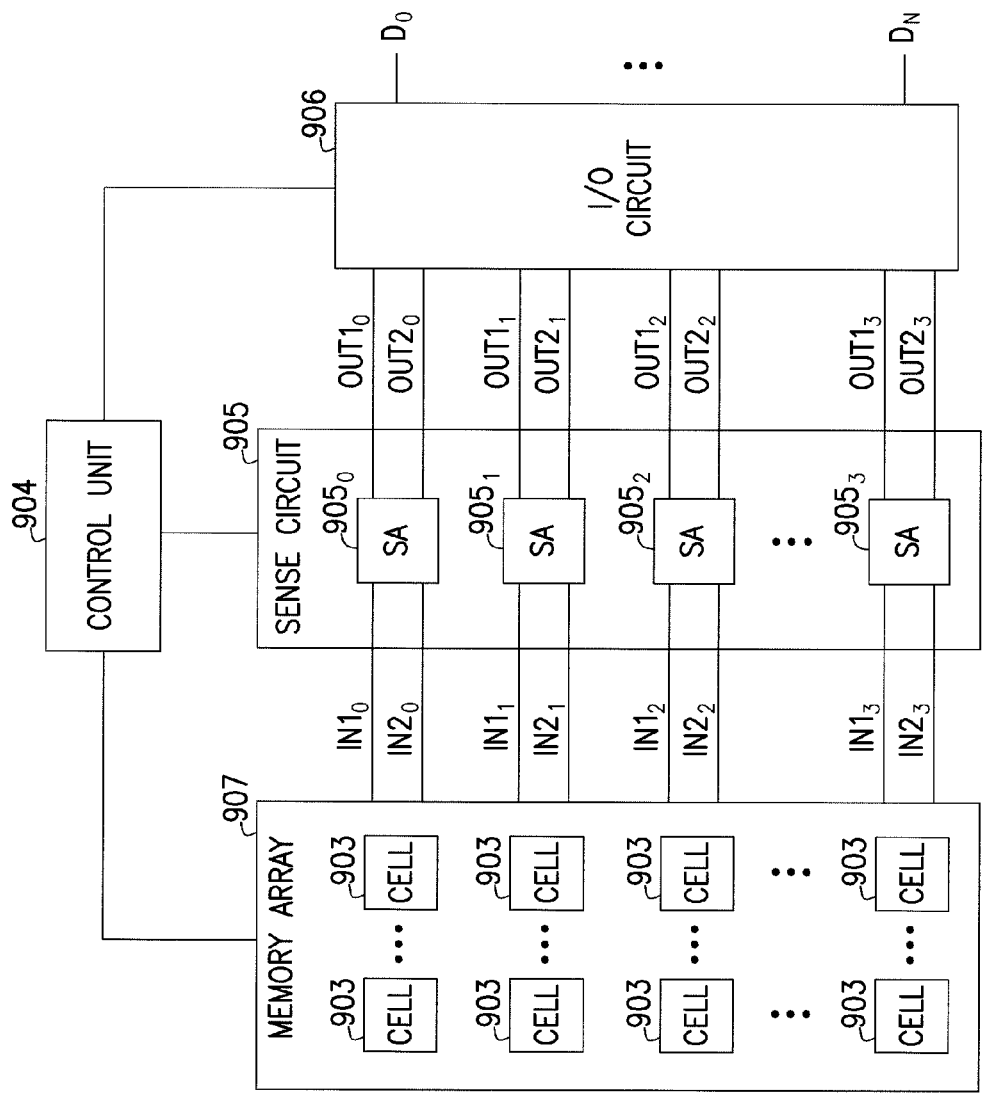
FIG. 9 shows a schematic diagram of an apparatus in the form of a memory device, according to some embodiments described herein

FIG. 9 shows a schematic diagram of an apparatus in the form of a memory device 902, according to some embodiments described herein. Memory device 902 can include memory cells 903 that can be arranged in rows and columns a memory array 907. Memory device 902 can include a control unit 904 to control operations of memory device 902. Example of such operations may include a write operation to store (e.g., write) information in memory cells 903, a read operation to retrieve (e.g., read) information from memory cells 903, and an erase operation to clear (e.g., erase) information from some or all of memory cells 903.

Memory device 902 can include a sense circuit 905 having sense amplifiers $905_0$, $905_1$, $905_2$, and $905_3$. FIG. 9 shows sense circuit 905 having four sense amplifiers $905_0$, $905_1$, $905_2$, and $905_3$ as an example. The number of sense amplifiers in sense circuit 905 may vary. During a read operation of memory device 902, depending on which of memory cells 903 are selected to be accessed in order to retrieve information from the selected memory cells, sense circuit 905 can operate to selectively sense input signals at its inputs to provide corresponding output signals at its outputs. In FIG. 9, signals $IN1_0$, $IN1_1$, $IN1_2$, $IN1_3$, $IN2_0$, $IN2_1$, $IN2_2$, and $IN2_3$ can be input signals provided to inputs of sense circuits 905 during a read operation, and signals $OUT1_0$, $OUT1_1$, $OUT1_2$, $OUT1_3$, $OUT2_0$, $OUT2_1$, $OUT2_2$, and $OUT2_3$ can be output signals provided at outputs of sense circuit 905 during the read operation.

Memory device 902 can include an input/output (I/O) circuit 906 to generate information (e.g., output data) $D_0$ through $D_N$ based on the output signals provided by sense circuit 905. Other devices (e.g., not shown, but can be a memory controller, a processor (e.g., CPU), or other devices) coupled to memory device 902 may receive output information $D_0$ through $D_N$ from memory device 902 during a read operation for further processing.

In FIG. 9, each of signals $IN1_0$, $IN1_1$, $IN1_2$, and $IN1_3$ can be provided from a node on a data line (e.g., bit line) associated with a selected memory cell among memory cells 903. Each of signals $IN2_0$, $IN2_1$, $IN2_2$, and $IN2_3$ can be provided from a node on another data line (e.g., another bit line) associated with another memory cell (e.g., a non-selected memory cell, or alternatively a reference memory cell) among memory cells 903. Alternatively, each of signals $IN2_0$, $IN2_1$, $IN2_2$, and $IN2_3$ can be provided from a node that provides a signal (e.g., reference voltage signal $V_{REF}$) having a relatively constant value (e.g., the value of voltage V2 associated with signal IN2 in FIG. 2).

As shown in FIG. 9, sense circuit 905 can include sense amplifiers (SAs) $905_0$, $905_1$, $905_2$, and $905_3$. Each of sense amplifiers $905_0$, $905_1$, $905_2$, and $905_3$ can include a latched comparator, such as comparator 405 of FIG. 4 or comparator 805 of FIG. 8. Thus, the operations of each of sense amplifiers $905_0$, $905_1$, $905_2$, and $905_3$ can be similar to, or identical to, the operations of comparator 405 of FIG. 4 or comparator 805 of FIG. 8 described above with reference to FIG. 4 through FIG. 8.

For example, during a read operation, signals $IN1_0$ and $IN2_0$ associated with a selected memory cell among memory cells 903 can be provided to sense amplifier $905_0$. The value of at least one of signals $IN1_0$ and $IN2_0$ can be based on the value of information (e.g., a bit of information) stored in the selected memory cell. Sense amplifier $905_0$ can operate in ways similar to comparator 405 to provide signals $OUT1_0$ and $OUT2_0$ having values (e.g., voltage V0 and V4) based on the values of signals $IN1_0$ and $IN2_0$.

Memory device 902 can include a volatile memory device (e.g., flash memory device), a non-volatile memory device (e.g., dynamic random access memory (DRAM) device), or combination of both. Memory device 902 can include other components, which are not shown in FIG. 9 to help focus on the embodiments described herein.

Figure 10:
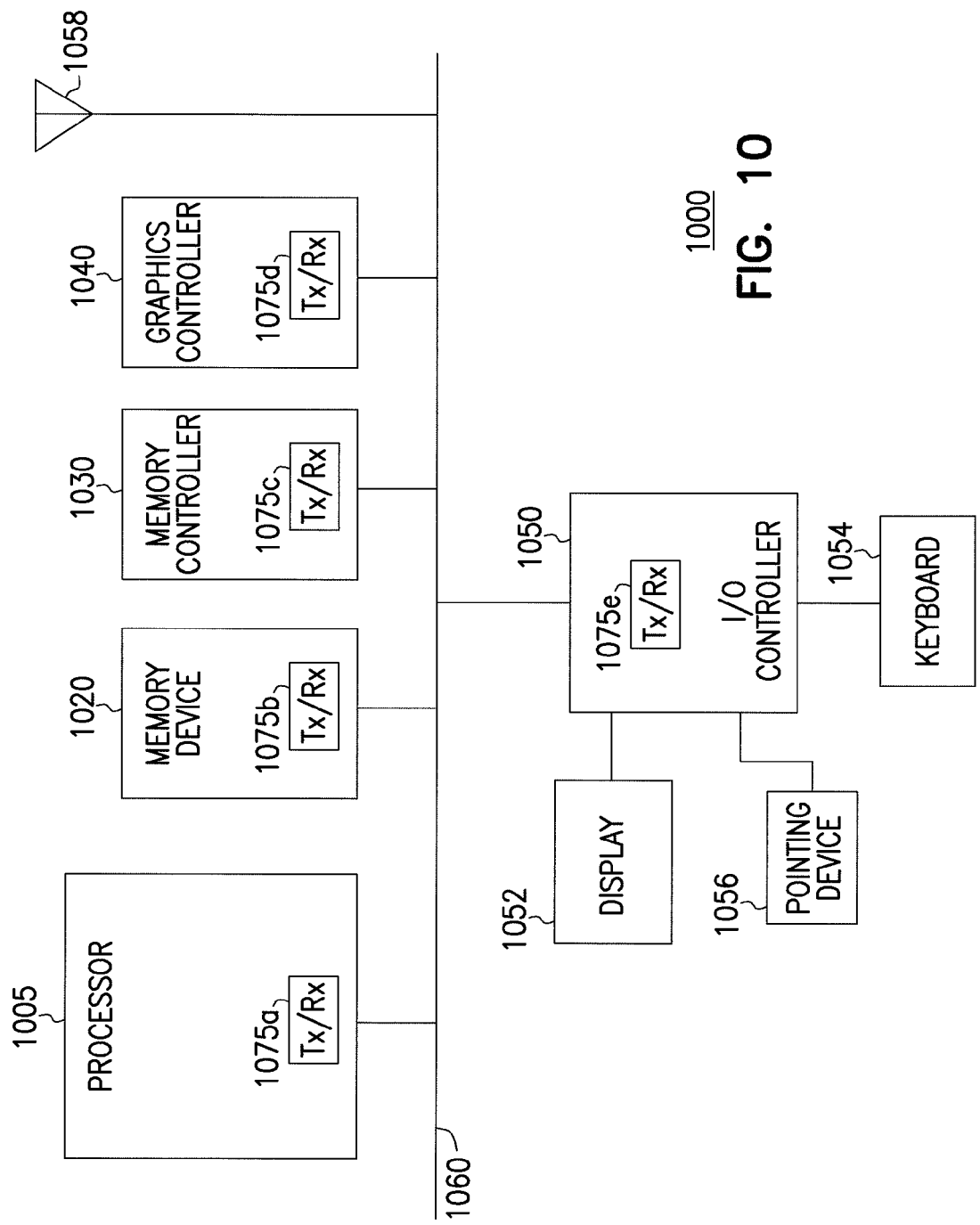
FIG. 10 shows an apparatus in the form of a system (e.g., an electronic system), according to some embodiments described herein.

FIG. 10 shows an apparatus in the form of a system (e.g., an electronic system) 1000 according to some embodiments described herein. System 1000 can include or be included in electronic device or system, such as a computer (e.g., server, desktop, laptop, or notebook), a tablet, a cellular phone, or other electronic devices. As shown in FIG. 10, system 1000 can include a processor 1005, a memory device 1020, a memory controller 1030, a graphics controller 1040, an input and output (I/O) controller 1050, a display 1052, a keyboard 1054, a pointing device 1056, at least one antenna 1058, and a bus 1060.

In some arrangements, system 1000 does not have to include a display. Thus, display 1052 can be omitted from system 1000. In some arrangements, system 1000 does not have to include any antenna. Thus, antenna 1058 can be omitted from system 1000.

Processor 1005 may include a general-purpose processor or an application specific integrated circuit (ASIC).

Memory device 1020 may include memory device 902 of FIG. 9. Memory device 1020 may include a dynamic random access memory (DRAM) device, a static random access memory (SRAM) device, a flash memory device, or a combination of these memory devices. FIG. 10 shows an example where memory device 1020 is a stand-alone memory device separated from processor 1005. In an alternative arrangement, memory device 1020 and processor 1005 can be located on the same die. In such an alternative arrangement, memory device 1020 is an embedded memory in processor 1005, such as embedded DRAM (eDRAM), embedded SRAM (eSRAM), embedded flash memory, or another type of embedded memory.

Display 1052 can include a liquid crystal display (LCD), a touchscreen (e.g., capacitive or resistive touchscreen), or another type of display. Pointing device 1056 can include a mouse, a stylus, or another type of pointing device.

I/O controller 1050 can include a communication module for wired or wireless communication (e.g., communication through one or more antenna 1058). Such wireless communication may include communication in accordance with WiFi communication technique, Long Term Evolution Advanced (LTE-A) communication technique, or other communication techniques.

FIG. 10 shows the components of system 1000 arranged separately from each other as an example. For example, each of processor 1005, memory device 1020, memory controller 1030, graphics controller 1040, and I/O controller 1050 can be located on a separate die (e.g., semiconductor die or an IC chip). In some arrangements, two or more components (e.g., processor 1005, memory device 1020, graphics controller 1040, and I/O controller 1050) of system 1000 can be located on the same IC chip.

Processor 1005, memory device 1020, memory controller 1030, graphics controller 1040, and I/O controller 1050 can include devices 101 and 102 of FIG. 1 or FIG. 2. For example, one of processor 1005, memory device 1020, memory controller 1030, graphics controller 1040, and I/O controller 1050 can include either device 102 of FIG. 1 or device 102 of FIG. 2. Thus, a particular component of system 1000 (e.g., one of processor 1005, memory device 1020, memory controller 1030, graphics controller 1040, and I/O controller 1050) may include either a combination of nodes $111_0$, $111_1$, $111_2$, and $111_3$, $112_0$, $112_1$, $112_2$, and $112_3$ (FIG. 1) or a combination of nodes $111_0$, $111_1$, $111_2$, and $111_3$, $212_0$, $212_1$, $212_2$, and $212_3$ (FIG. 2).

As shown in FIG. 10, of processor 1005, memory device 1020, memory controller 1030, graphics controller 1040, and I/O controller 1050 can include transceivers 1075$a$, 1075$b$, 1075$c$, 1075$d$, and 1075$e$, respectively, to allow each of these components to transmit and receive signals through their respective transceiver. At least one of transceivers 1075$a$, 1075$b$, 1075$c$, 1075$d$, and 1075$e$ can include a receiver (e.g., receiver 120 of FIG. 1). The receiver can include at least one of the comparators (e.g., at least one of comparators $105_0$, $105_1$, $105_2$, and $105_3$, 405, and 805) and the operations of the comparators described above with reference to FIG. 1 through FIG. 9.

The illustrations of apparatus (e.g., apparatus 100, 200, comparators 405 and 805, memory device 902, and system 1000) described above with reference to FIG. 1 through FIG. 10 are intended to provide a general understanding of the structure of various embodiments and are not intended to provide a complete description of all the elements and features of apparatuses that might make use of the structures described herein.

The apparatus (e.g., apparatus 100, 200, comparators 405 and 805, memory device 902, and system 1000) described herein may include or be included in electronic circuitry, such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 5) players), vehicles, medical devices (e.g., heart monitor, blood pressure monitor, etc.), set top boxes, and others.

ADDITIONAL NOTES AND EXAMPLES

Example 1 includes subject matter (such as a device, an electronic apparatus (e.g., circuit, electronic system, or both), or machine) including input nodes to receive input signals, output nodes to provide output signals, a first stage including a first pair of input transistors, the first pair of input transistors including gates coupled to the input nodes, a second stage including a second pair of input transistors, the second pair of input transistors including gates coupled to the input nodes, and a third stage including inverters coupled to the output nodes, the inverters coupled to the first and second stages at same nodes to switch the output signals between different voltages based on the input signals.

In Example 2, the subject matter of Example 1 may optionally include a circuit coupled to the output nodes to provide first and second additional output signals based on the output signals.

In Example 3, the subject matter of Example 2 may optionally include, wherein the circuit includes a first logic gate and a second logic gate, the first logic gate including a first input coupled to the second output node, a second input coupled to an output of the second logic gate, and an output coupled to a first input of the second logic gate, the second logic gate including a second input coupled to the first output node In Example 4, the subject matter of Example 1 may optionally include, wherein the second stage is arranged to receive a signal to deactivate the second stage during operation of the first and second stages.

In Example 5, the subject matter of Example 4 may optionally include, wherein the second stage is configured to assist the first stage to sample the input signals when a value of at least one of the input signals is less than one-half of a value of an operating voltage of the third stage.

In Example 6, the subject matter of Example 5 may optionally include, wherein the second stage is configured to assist the first stage to sample the input signals when a value of at least one of the input signals is greater than one-half of a value of an operating voltage of the third stage.

In Example 7, the subject matter of Example 1 may optionally include, wherein the input nodes, the output nodes, and the first, second, and third stages are included in a device of the apparatus, the device including memory cells and data lines coupled to the input nodes, wherein one of the input signals has a value based on a value of a selected memory cell among the memory cells.

Example 8 includes subject matter (such as a device, an electronic apparatus (e.g., circuit, electronic system, or both), or machine) including a first input node and a second input node, a first output node and second output node, a first plurality of transistors coupled between a first supply node and a second supply node, the first plurality of transistors including a first transistor and a second transistor coupled between the first output node and the second supply node, a second plurality of transistors coupled between the first and second supply nodes, the second plurality of transistors including a third transistor and a fourth transistor coupled between the second output node and the second supply node, a first input transistor coupled between the second supply node and a node between the first and second transistors, the first input transistor including a gate coupled to the first input node, and a second input transistor coupled between the second supply node and a node between the third and fourth transistors, the second input transistor including a gate coupled to the second input node.

In Example 9, the subject matter of Example 8 may optionally include a third input transistor coupled between the first and second supply nodes, the third input transistor including a gate coupled to the first input node, and a fourth input transistor coupled between the first and second supply nodes, the fourth input transistor including a gate coupled to the second input node.

In Example 10, the subject matter of Example 9 may optionally include, wherein the first and second input transistors have a first transistor type and the third and fourth input transistors have a second transistor type.

In Example 11, the subject matter of Example 10 may optionally include, wherein the first transistor type includes n-type and the second transistor type includes p-type.

In Example 12, the subject matter of Example 10 may optionally include, wherein the first transistor type includes p-type and the second transistor type includes n-type.

In Example 13, the subject matter of Example 8 may optionally include, wherein the first plurality of transistors includes a fifth transistor coupled between the first output node and the first supply node, and the second plurality of transistors includes a sixth transistor coupled between the second output node and the first supply node.

In Example 14, the subject matter of Example 13 may optionally include, wherein the first plurality of transistors includes a seventh transistor coupled between the first output node and the first supply node, and the second plurality of transistors includes an eighth transistor coupled between the second output node and the first supply node.

In Example 15, the subject matter of Example 8 may optionally include, wherein the first and second transistors of the first plurality of transistors and the third and fourth transistors of the second plurality of transistors have a same transistor type.

In Example 16, the subject matter of Example 8 may optionally include, wherein at least one of the first and second supply nodes is coupled to a data line associated with a memory cell.

Example 17 includes subject matter (such as a device, an electronic apparatus (e.g., circuit, electronic system, or both), or machine) including a first node included in a first device to receive a first signal provided from a second device, a second node included in the first device to receive a second input signal generated by the first device, and a receiver included in the first device, the receiver including a comparator coupled to the first and second nodes, the comparator including output nodes to provide output signals, a first stage including a first pair of input transistors, the first pair of input transistors including gates coupled to the input nodes, a second stage including a second pair of input transistors, the second pair of input transistors including gates coupled to the input nodes, and a third stage including inverters coupled to the output nodes, the inverters coupled to the first and second stages at same nodes to switch the output signals between different voltages based on the input signals.

In Example 18, the subject matter of Example 17 may optionally include, wherein the first node is part of one of a solder ball, a solder bump, and a pin.

In Example 19, the subject matter of Example 17 may optionally include, wherein the first node is arranged to couple to a conductive path on a circuit board.

In Example 20, the subject matter of Example 17 may optionally include, wherein the first device is included in a first die, and the second device is included in a second die.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
    input nodes to receive input signals;
    output nodes to provide output signals;
    a first stage including a first pair of input transistors, the first pair of input transistors including gates coupled to the input nodes;
    a second stage including a second pair of input transistors, the second pair of input transistors including gates coupled to the input nodes; and
    a third stage including inverters coupled to the output nodes, the inverters coupled to the first and second stages to switch the output signals between different voltages based on the input signals, the inverters including a first inverter and a second inverter, the first inverter coupled to the first and second stages at a same node of the first inverter, and the second inverter coupled to the first and second stages at a same node of the second inverter.

2. The apparatus of claim 1, further comprising a circuit coupled to the output nodes to provide first and second additional output signals based on the output signals.

3. The apparatus of claim 2, wherein the circuit includes a first logic gate and a second logic gate, the first logic gate including a first input coupled to a first output node of the output nodes, a second input coupled to an output of the second logic gate, and an output coupled to a first input of the second logic gate, the second logic gate including a second input coupled to a second output node of the output nodes.

4. The apparatus of claim 1, wherein the second stage is arranged to receive a signal to deactivate the second stage.

5. The apparatus of claim 1, wherein the input nodes, the output nodes, and the first, second, and third stages are included in a device of the apparatus, the device including memory cells and data lines coupled to the input nodes, wherein one of the input signals has a value based on a value of a selected memory cell among the memory cells.

6. An apparatus comprising:
    input nodes to receive input signals;
    output nodes to provide output signals;

a first stage including a first pair of input transistors, the first pair of input transistors including gates coupled to the input nodes;

a second stage including a second pair of input transistors, the second pair of input transistors including gates coupled to the input nodes; and a third stage including inverters coupled to the output nodes, the inverters coupled to the first and second stages at same nodes to switch the output signals between different voltages based on the input signals, wherein the second stage is configured to assist the first stage to sample the input signals when a value of at least one of the input signals is less than one-half of a value of an operating voltage of the third stage.

7. The apparatus of claim 6, wherein the second stage is configured to assist the first stage to sample the input signals when a value of at least one of the input signals is greater than one-half of a value of an operating voltage of the third stage.

8. An apparatus comprising:
a first input node and a second input node;
a first output node and a second output node;
a first plurality of transistors coupled between a first supply node and a second supply node, the first plurality of transistors including a first transistor and a second transistor coupled between the first output node and the second supply node, the first transistor coupled between the first output node and a first node, the second transistor coupled between the first node and the second supply node;
a second plurality of transistors coupled between the first and second supply nodes, the second plurality of transistors including a third transistor and a fourth transistor coupled between the second output node and the second supply node, the third transistor coupled between the second output node and a second node, the fourth transistor coupled between the second node and the second supply node;
a first input transistor coupled between the second supply node and a node between the first and second transistors, the first input transistor including a gate coupled to the first input node; and
a second input transistor coupled between the second supply node and a node between the third and fourth transistors, the second input transistor including a gate coupled to the second input node.

9. The apparatus of claim 8, further comprising:
a third input transistor coupled between the first and second supply nodes, the third input transistor including a gate coupled to the first input node; and
a fourth input transistor coupled between the first and second supply nodes, the fourth input transistor including a gate coupled to the second input node.

10. The apparatus of claim 9, wherein the first and second input transistors have a first transistor type and the third and fourth input transistors have a second transistor type.

11. The apparatus of claim 10, wherein the first transistor type includes n-type and the second transistor type includes p-type.

12. The apparatus of claim 10, wherein the first transistor type includes p-type and the second transistor type includes n-type.

13. The apparatus of claim 8, wherein the first and second transistors of the first plurality of transistors and the third and fourth transistors of the second plurality of transistors have a same transistor type.

14. The apparatus of claim 8, wherein at least one of the first and second input nodes is coupled to a data line associated with a memory cell.

15. A first input node and a second input node;
a first output node and a second output node;
a first plurality of transistors coupled between a first supply node and a second supply node, the first plurality of transistors including a first transistor and a second transistor coupled between the first output node and the second supply node;
a second plurality of transistors coupled between the first and second supply nodes, the second plurality of transistors including a third transistor and a fourth transistor coupled between the second output node and the second supply node;
a first input transistor coupled between the second supply node and a node between the first and second transistors, the first input transistor including a gate coupled to the first input node; and
a second input transistor coupled between the second supply node and a node between the third and fourth transistors, the second input transistor including a gate coupled to the second input node, wherein the first plurality of transistors includes a fifth transistor coupled between the first output node and the first supply node, and the second plurality of transistors includes a sixth transistor coupled between the second output node and the first supply node.

16. The apparatus of claim 15, wherein the first plurality of transistors includes a seventh transistor coupled between the first output node and the first supply node, and the second plurality of transistors includes an eighth transistor coupled between the second output node and the first supply node.

17. An apparatus comprising:
a first node included in a first device to receive a first signal provided from a second device;
a second node included in the first device to receive a second input signal generated by the first device; and
a receiver included in the first device, the receiver including a comparator coupled to the first and second nodes, the comparator including:
output nodes to provide output signals;
a first stage including a first pair of input transistors, the first pair of input transistors including gates coupled to the input nodes;
a second stage including a second pair of input transistors, the second pair of input transistors including gates coupled to the input nodes; and
a third stage including inverters coupled to the output nodes, the inverters coupled to the first and second stages to switch the output signals between different voltages based on the input signals, the inverters including a first inverter and a second inverter, the first inverter coupled to the first and second stages at a same node of the first inverter, and the second inverter coupled to the first and second stages at a same node of the second inverter.

18. The apparatus of claim 17, wherein the first node is part of one of a solder ball, a solder bump, and a pin.

19. The apparatus of claim 17, wherein the first node is arranged to couple to a conductive path on a circuit board.

20. The apparatus of claim 17, wherein the first device is included in a first die, and the second device is included in a second die.

* * * * *